United States Patent
Lee et al.

(10) Patent No.: US 12,457,901 B2
(45) Date of Patent: Oct. 28, 2025

(54) METHOD FOR MANUFACTURING GRAPHENE THERMOELECTRIC DEVICE AND GRAPHENE THERMOELECTRIC DEVICE MANUFACTURED THEREBY

(71) Applicant: POSTECH Research and Business Development Foundation, Pohang-si (KR)

(72) Inventors: Byoung Hun Lee, Pohang-si (KR); Hyeon Jun Hwang, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 2 days.

(21) Appl. No.: 18/470,288

(22) Filed: Sep. 19, 2023

(65) Prior Publication Data

US 2024/0099136 A1    Mar. 21, 2024

(30) Foreign Application Priority Data

Sep. 21, 2022    (KR) .................... 10-2022-0119372

(51) Int. Cl.
*H10N 10/01*    (2023.01)
*H10N 10/855*    (2023.01)

(52) U.S. Cl.
CPC ........... *H10N 10/01* (2023.02); *H10N 10/855* (2023.02)

(58) Field of Classification Search
CPC .............................. H10N 10/01; H10N 10/855
See application file for complete search history.

(56) References Cited

U.S. PATENT DOCUMENTS

2022/0199884 A1 *    6/2022    Wang ............... H10N 10/17

FOREIGN PATENT DOCUMENTS

KR    101372286    *    3/2014
KR    10-2332127 B1    11/2021

OTHER PUBLICATIONS

Oh et al., Graphene Doping Methods and Device Applications, Journal of Nanoscience and Nanotechnology, vol. 14, pp. 1120-1133 (Year: 2014).*
Lee et al., Graphene transfer in vacuum yielding a high quality graphene, Science Direct, Carbon vol./Issue 93, pp. 286-294 (Year: 2015).*
Kim et al., Chemically doped graphene based ternary field effect transistors, Journal of Applied Physics, vol./Issue 58, pp. 1-5 (Year: 2019).*
An et al., Doping of graphene with polyethylenimine and its effects on graphene-based supercapacitors, Journal of Applied Physics, vol./Issue 129, pp. 1-17 (Year: 2021).*

* cited by examiner

*Primary Examiner* — Jayne L Mershon
(74) *Attorney, Agent, or Firm* — Morgan,, Lewis & Bockius LLP

(57) ABSTRACT

Disclosed herein are a method for manufacturing a graphene thermoelectric device and a graphene thermoelectric device manufactured thereby. The method for manufacturing a graphene thermoelectric device includes: forming a graphene channel layer on a substrate; forming a thermoelectric structure by depositing a first electrode and a second electrode on both ends of the graphene channel layer; and doping the graphene channel layer by dipping the thermoelectric structure into a doping solution.

3 Claims, 9 Drawing Sheets

[Fig 1]
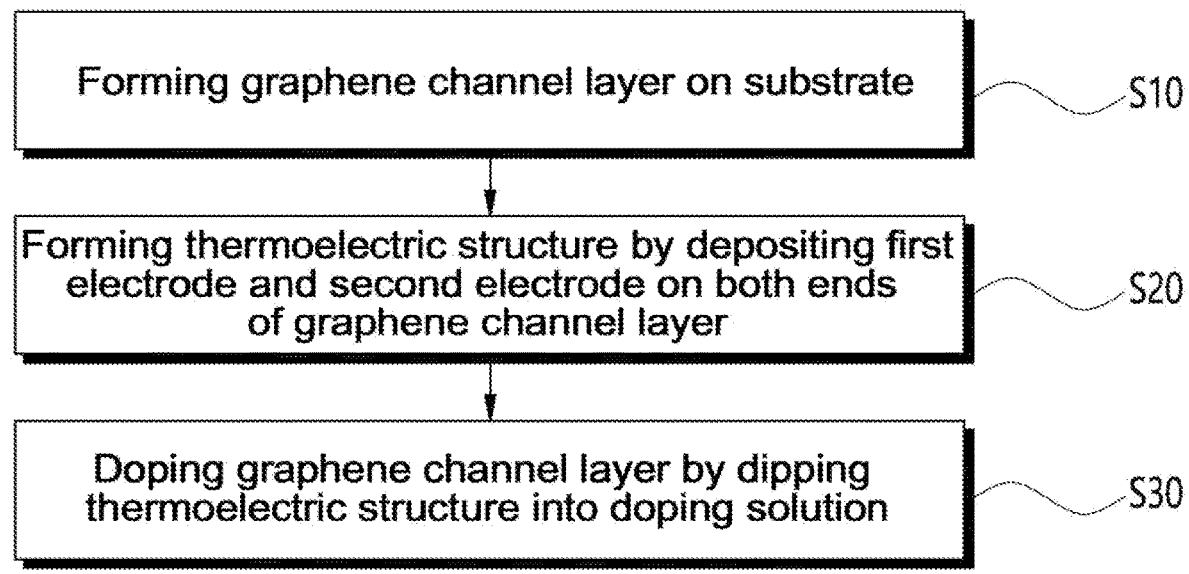
[Fig 2]
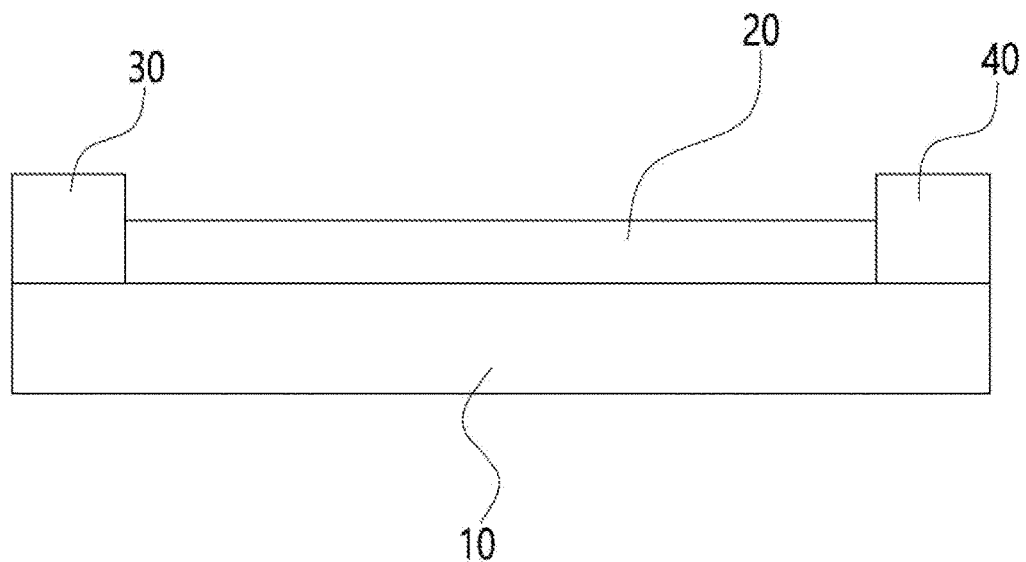

[Fig 3]
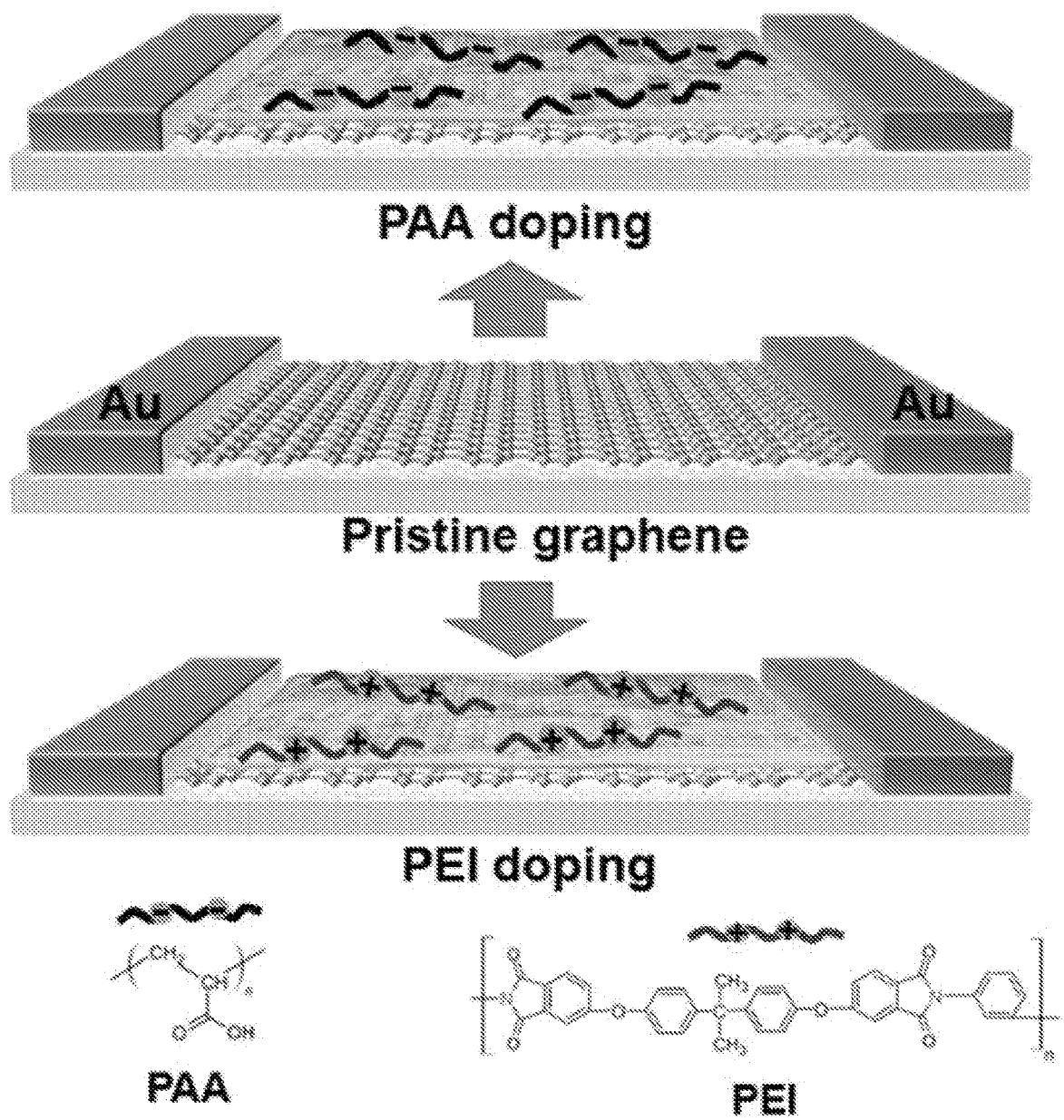

[Fig 4]
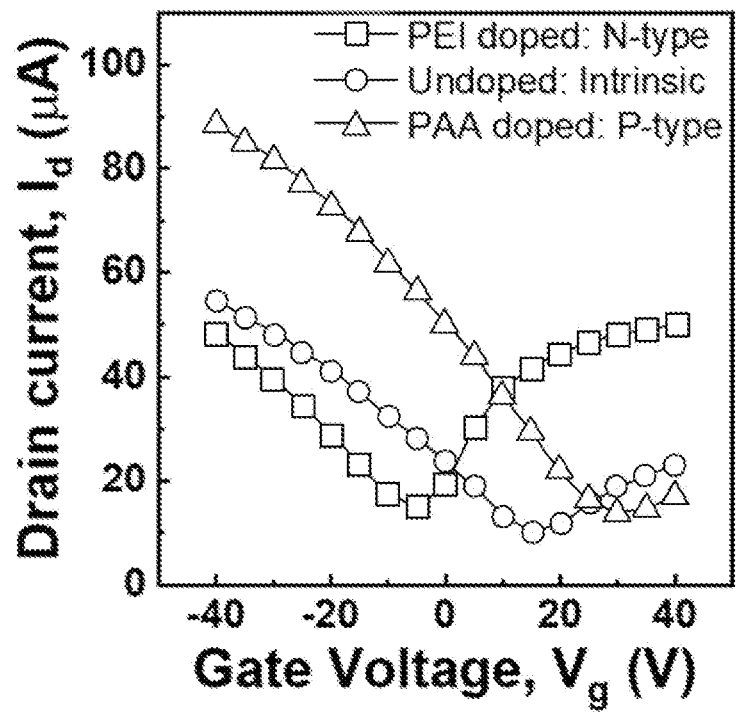
[Fig 5(a)]
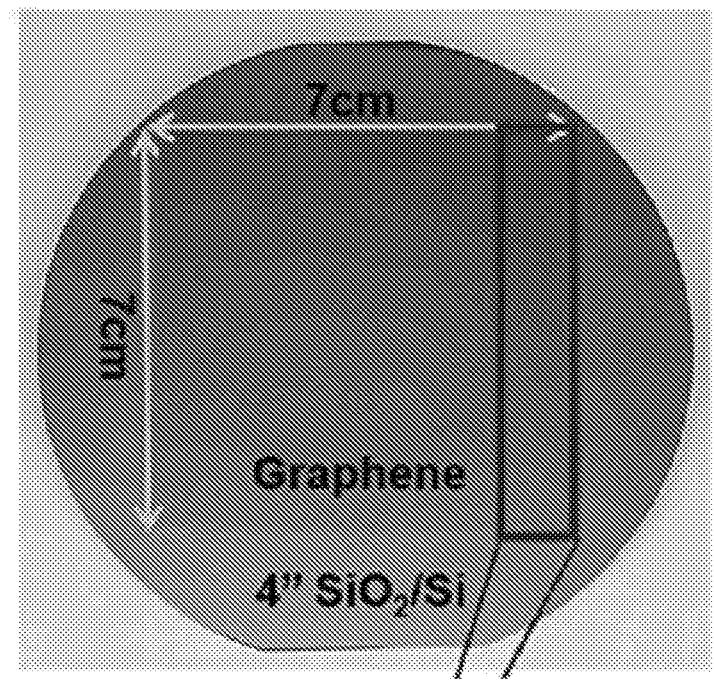

[Fig 5(b)]
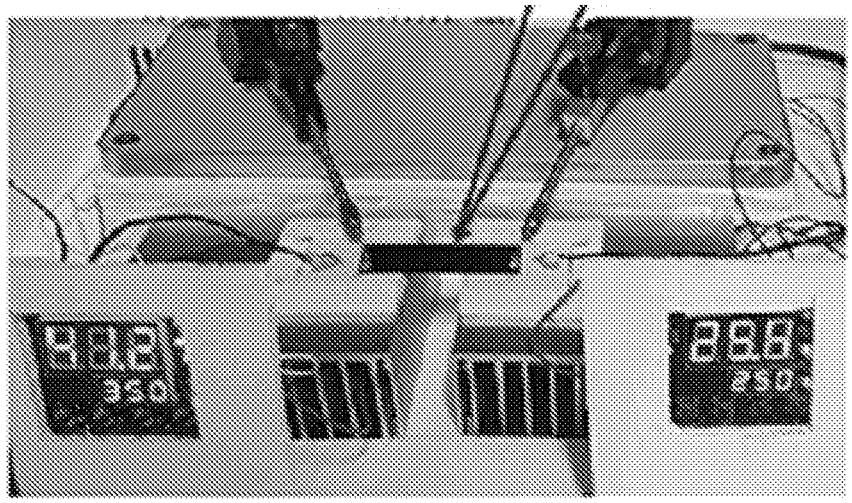
[Fig 5(c)]
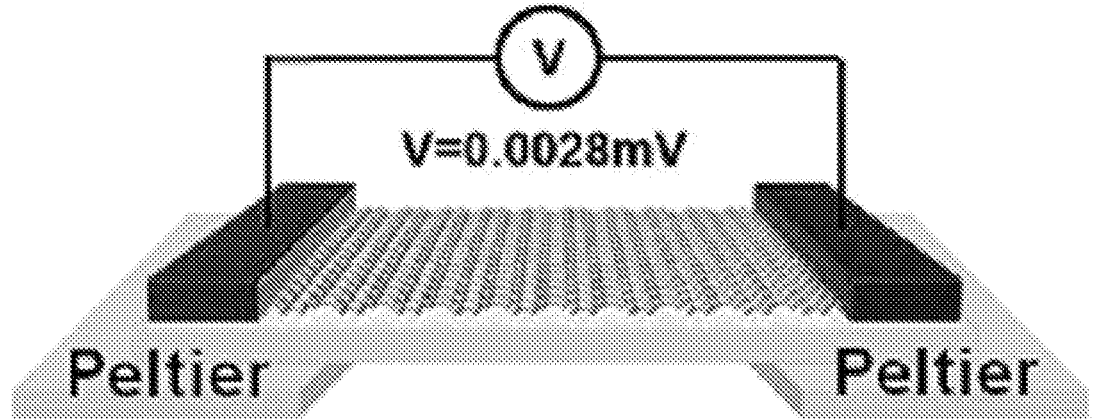
[Fig 5(d)]
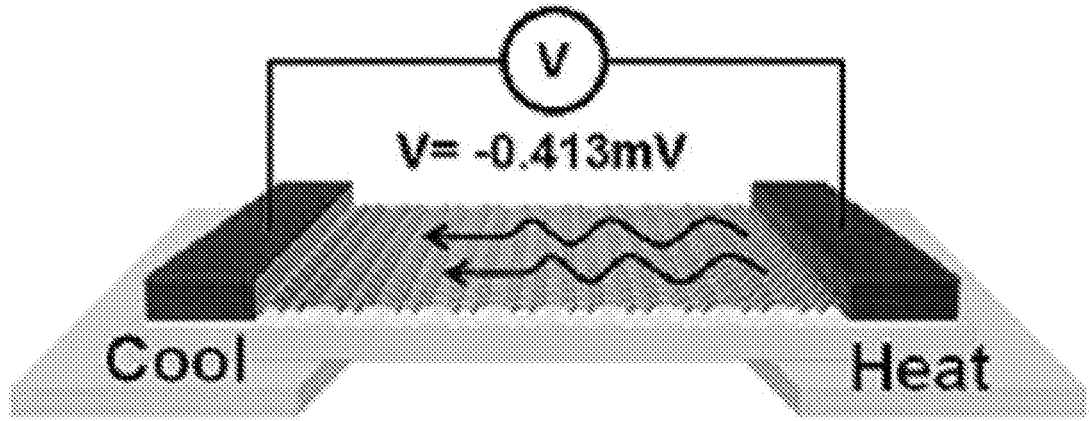

[Fig 5(e)]
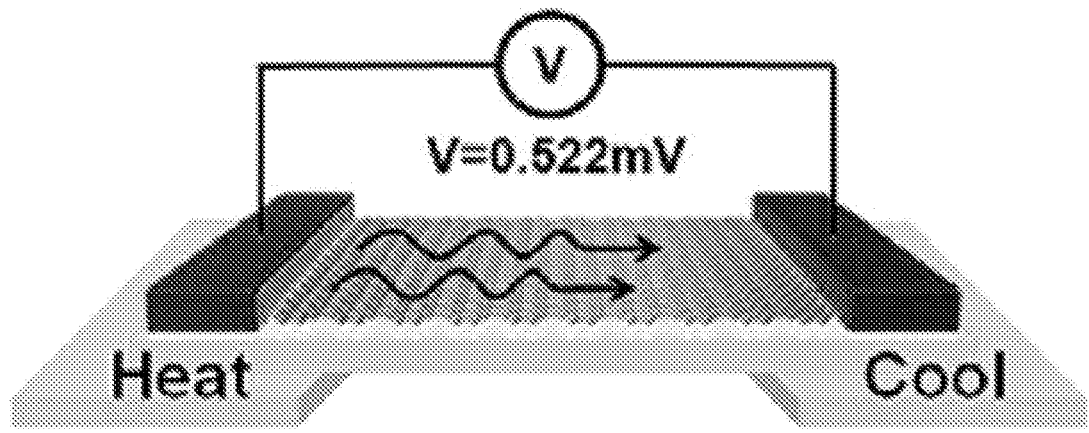
[Fig 6]
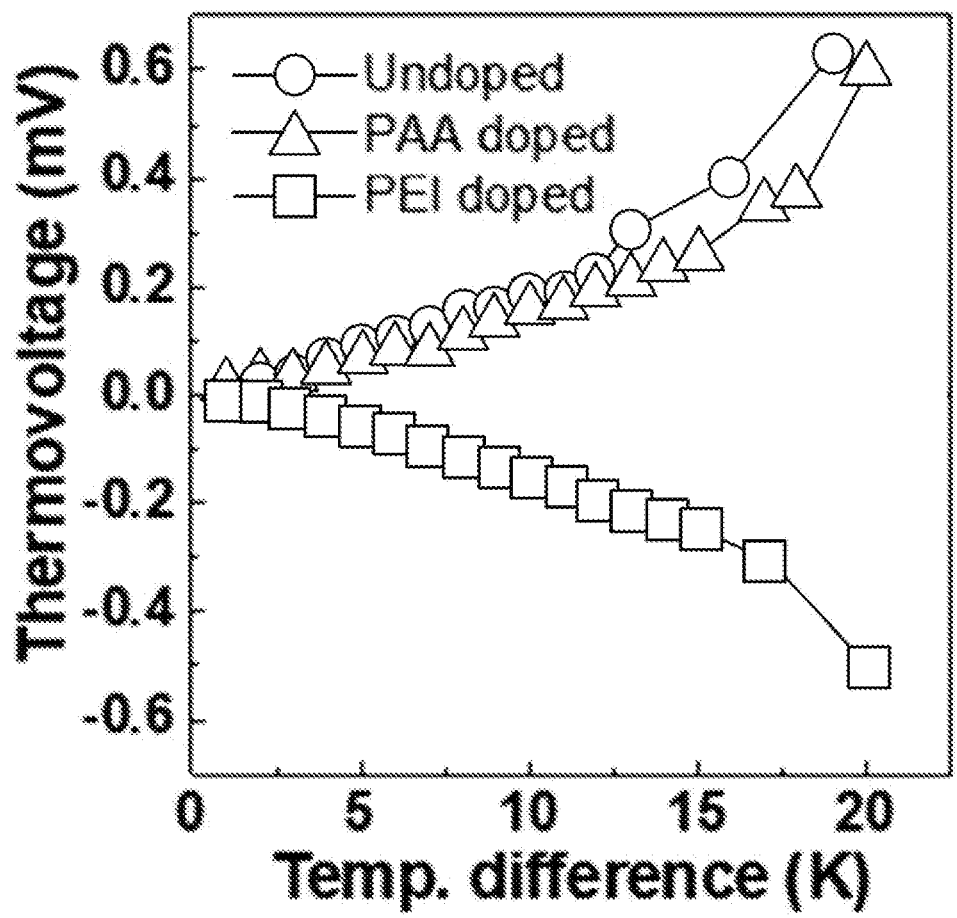

[Fig 7]
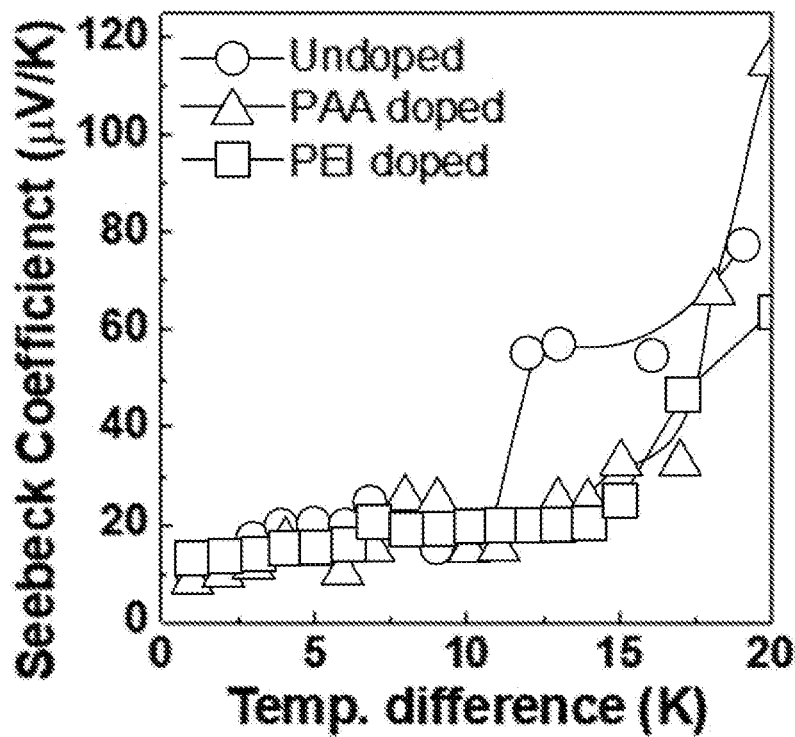
[Fig 8]
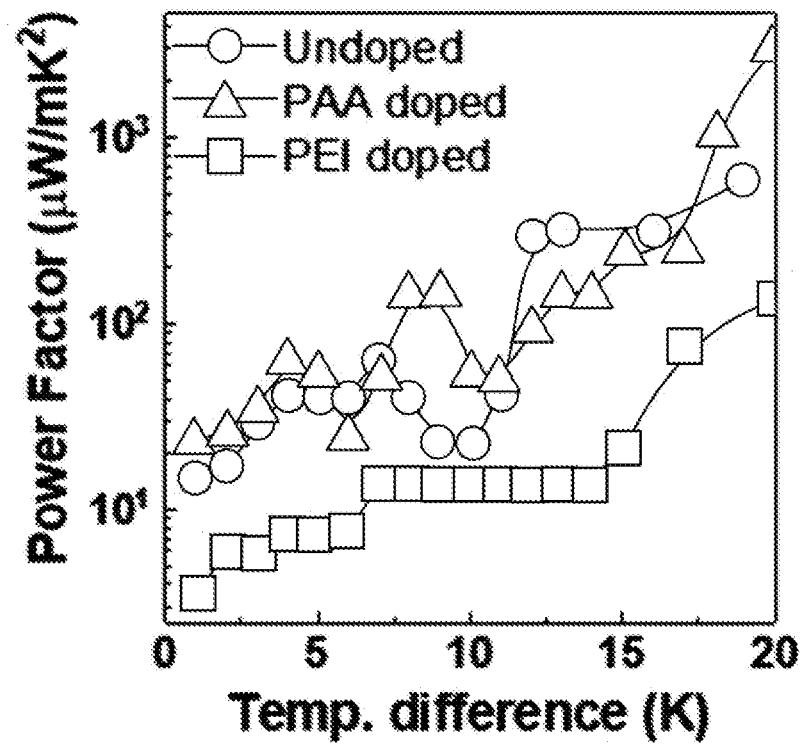

[Fig 9(a)]
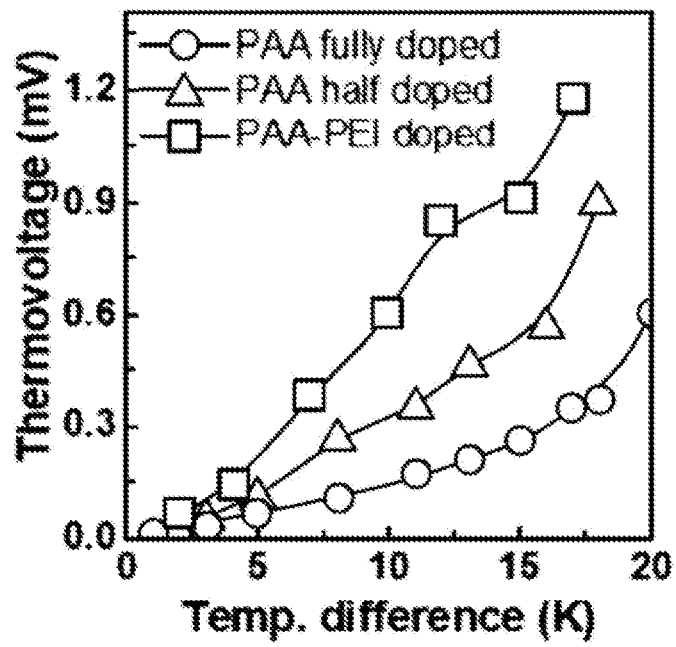
[Fig 9(b)]
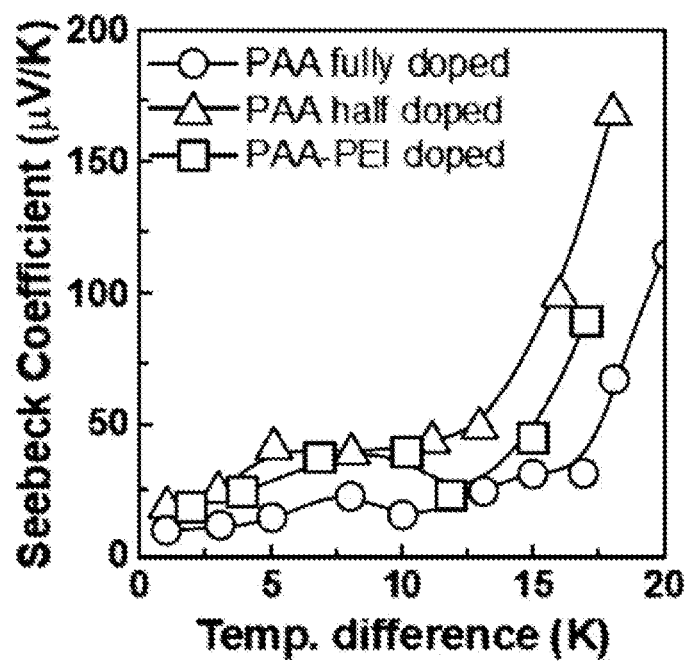

[Fig 9(c)]
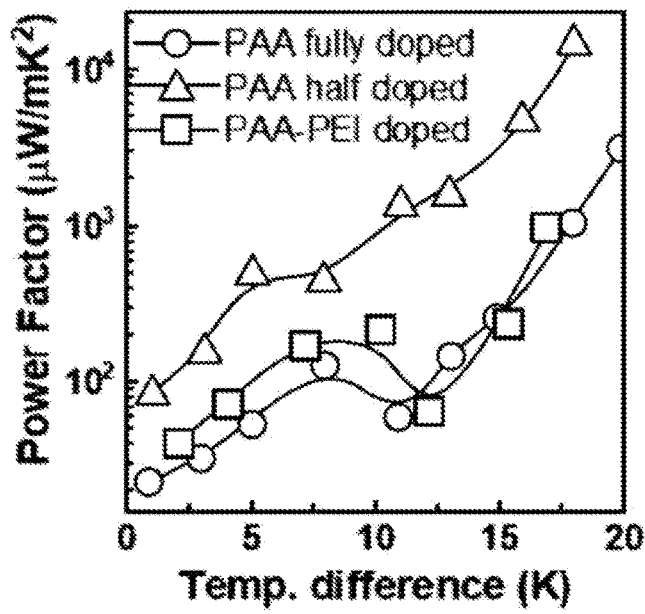
[Fig 9(d)]
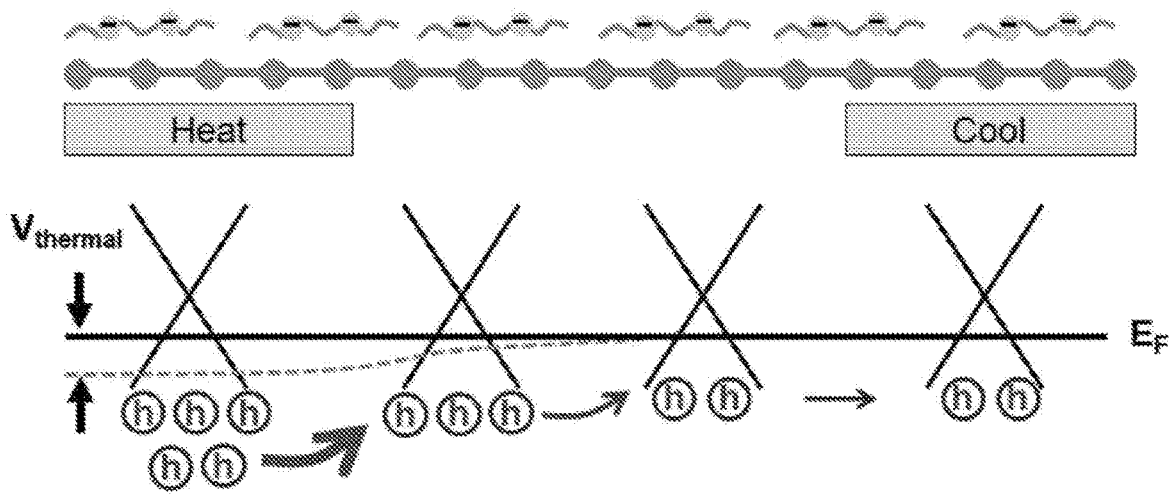

[Fig 9(e)]
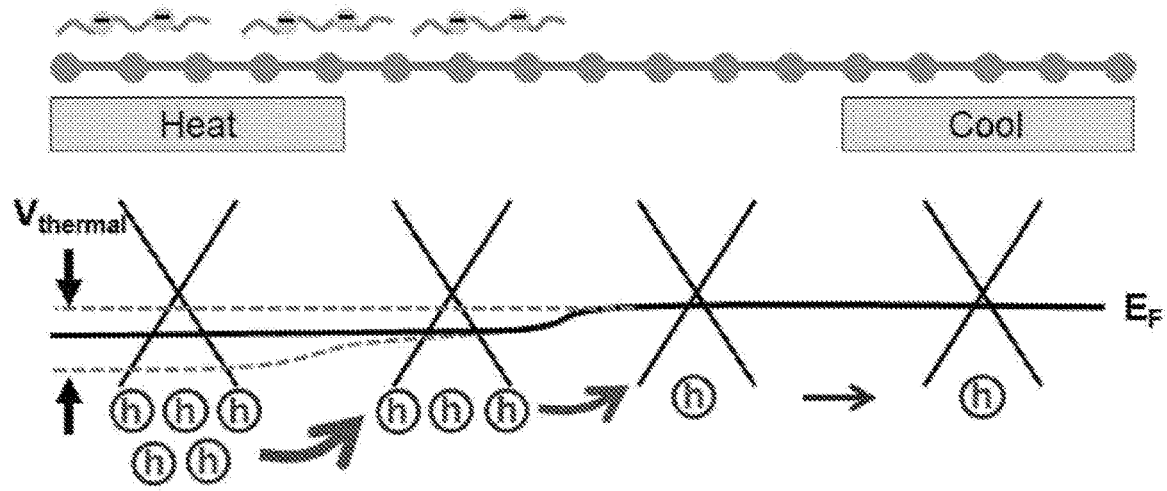
[Fig 9(f)]
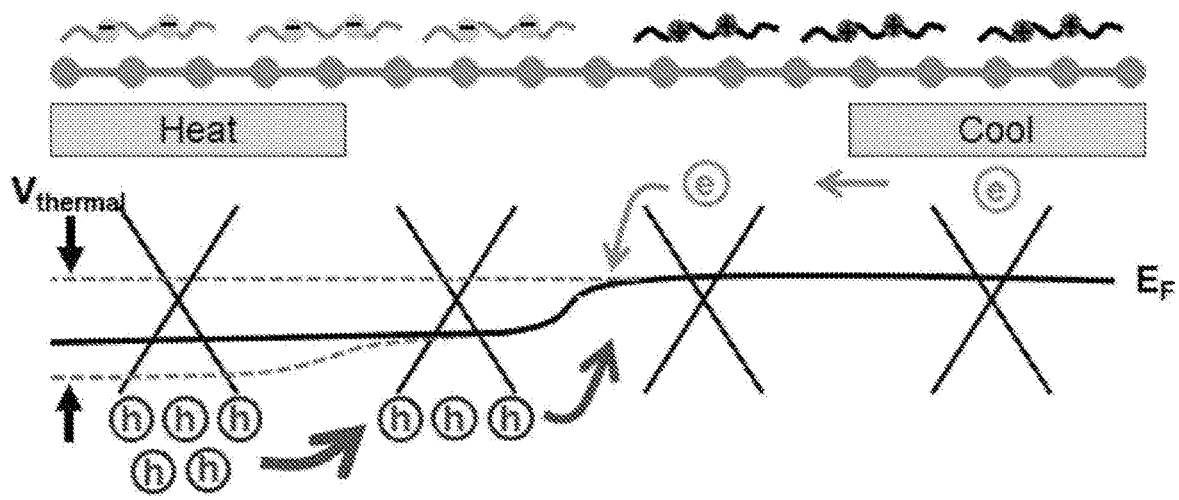

METHOD FOR MANUFACTURING GRAPHENE THERMOELECTRIC DEVICE AND GRAPHENE THERMOELECTRIC DEVICE MANUFACTURED THEREBY

CROSS-REFERENCE TO RELATED PATENT APPLICATION

This application claims the benefit of Korean Patent Application No. 10-2022-0119372, filed on Sep. 21, 2022, in the Korean Intellectual Property Office, the disclosure of which is incorporated herein in its entirety by reference.

BACKGROUND OF THE INVENTION

1. Field of the Invention

The present invention relates to a method for manufacturing a graphene thermoelectric device and a graphene thermoelectric device manufactured thereby, and more particularly, to a method for manufacturing a graphene thermoelectric device and a graphene thermoelectric device manufactured thereby, which can enhance the thermoelectric efficiency by chemical doping of graphene and modulation of doping concentration.

2. Description of the Related Art

Thermoelectric phenomenon refers to the reversible and direct energy conversion between heat and electricity caused by the transfer of heat (phonons) due to the movement of electrons and holes in a material. It can be divided into two effects: the Peltier effect, which converts electrical energy into heat energy for thermoelectric refrigeration, and the Seebeck effect, which converts heat energy into electrical energy for thermoelectric generation.

Specifically, thermoelectric devices consist of p-n junctions made of thermoelectric semiconductors, such as Mg—Si alloys, Zn—Sb alloys, Ag—Sb—Te alloys, Bi—Te alloys, etc., to convert heat energy into electrical energy. Recently, they are considered as a prominent technology that can simultaneously satisfy energy and environmentally friendly policies, and these devices can use various forms of heat, such as solar thermal energy, waste heat from automobiles, geothermal energy, body heat, heat from radiation sources, etc., as energy sources.

However, conventional inorganic materials such as Bi, Te, and Pb are toxic and require expensive processes, and thus there is a need for an alternative solution to address these issues. Therefore, research on thermoelectric devices using organic materials such as polyaniline (PANI), polypyrrole (PPY), and poly(3,4-ethylenedioxythiophene):poly(styrenesulfonate) (PEDOT:PSS) has been actively conducted. (e.g., Korean Patent No.: 10-2332127), These thermoelectric devices can be fabricated at low cost using a low-temperature solution process and has excellent mechanical flexibility, but the thermoelectric efficiency is reduced due to low electrical conductivity, and thus there is a need for a technique to address these issues.

Meanwhile, graphene is an atomic monolayer sheet exfoliated from graphite, and refers to a nano material in the form of a thin film in which carbon atoms are packed in a honeycomb structure. Graphene is known for its high strength and excellent electrical properties compared to copper and silicon. It has been studied that the excellent electrical characteristics of graphene are modulated by doping sources and doping levels.

Accordingly, the applicant has developed a technology capable of effectively applying graphene in thermoelectric devices.

PRIOR-ART LITERATURE

Korean Patent No.: 10-2332127

SUMMARY OF THE INVENTION

The present invention has been made in an effort to solve the above-described problems associated with prior art, and an object of the present invention is to provide a method for manufacturing a graphene thermoelectric device and a graphene thermoelectric device manufactured thereby, which can enhance the thermoelectric efficiency using graphene.

In order to achieve the above object, one aspect of the present invention provides a method for manufacturing a graphene thermoelectric device, the method comprising the steps of: forming a graphene channel layer on a substrate; forming a thermoelectric structure by depositing a first electrode and a second electrode on both ends of the graphene channel layer; and doping the graphene channel layer by dipping the thermoelectric structure into a doping solution.

The step of forming a graphene channel layer on a substrate may comprise: growing graphene on a metallic material; sequentially forming a first support layer and a second support layer on the graphene to prepare a graphene film; removing the metallic material; transferring the graphene film from which the metallic material is removed to the substrate in a vacuum environment; and removing the first support layer and the second support layer.

The step of doping the graphene channel layer may comprise selectively doping half or full of the full area of the graphene channel layer with a specific type of conductivity.

The doping solution may comprise: at least one dopant selected from polyethylenimine (PEI) and polyacrylic acid (PAA); ethanol; and lithium perchlorate. Furthermore, if the doping solution may have polymer containing positive charge such as PEI, the doping solution does not depart from the subject matter of this invention.

The step of doping the graphene channel layer may comprise n-type doping of the graphene channel layer with a doping solution containing polyethyleneimine (PEI).

The step of doping the graphene channel layer may comprise p-type doping of the graphene channel layer with a doping solution containing polyacrylic acid (PAA).

Another aspect of the present invention provides a graphene thermoelectric device manufactured by the above-described method for manufacturing a graphene thermoelectric device, the graphene thermoelectric device comprising: a substrate 10; a graphene channel layer 20 formed on the substrate 10 and including doped graphene; and a first electrode 30 and a second electrode 40 formed on both ends of the graphene channel layer 20.

The graphene channel layer 20 may be obtained by doping half or full area of the graphene channel layer 20.

The graphene channel layer 20 may be n-type doped with polyethyleneimine (PEI).

The graphene channel layer 20 may be p-type doped with polyacrylic acid (PAA).

According to the method for manufacturing the graphene thermoelectric device and the graphene thermoelectric device manufactured thereby of the present invention, it is possible to improve the electrical conductivity of graphene by chemical doping of graphene and modulation of doping concentration.

As a result, it is possible to improve the thermoelectric efficiency of the graphene thermoelectric device including the doped graphene.

Moreover, according to the method for manufacturing the graphene thermoelectric device and the graphene thermoelectric device manufactured thereby of the present invention, it is possible to effectively increase the power factor of the thermoelectric device due to heat dissipation during carrier diffusion in the doped graphene and the large size of active region.

Furthermore, the method for manufacturing the graphene thermoelectric device of the present invention suggests a doping method of graphene and an optimal range of doping concentration suitable for the channel layer of the thermoelectric device, facilitating the doping of graphene suitable for thermoelectric devices.

The technical effects of the present invention are not limited to those mentioned above, and other technical effects not mentioned will be clearly understood by those skilled in the art from the description below.

BRIEF DESCRIPTION OF THE DRAWINGS

The above and other features and advantages of the present invention will become more apparent by describing in detail exemplary embodiments thereof with reference to the attached drawings in which:

FIG. 1 is a flowchart illustrating a method for manufacturing a graphene thermoelectric device according to an embodiment of the present invention;

FIG. 2 is a cross-sectional view of a graphene thermoelectric device according to an embodiment of the present invention;

FIG. 3 is a schematic diagram of graphene thermoelectric devices manufactured with and without a doping process and with different dopants according to an embodiment of the present invention;

FIG. 4 shows transfer curves of graphene field effect transistors (GFETs) prepared in Preparation Examples 2 to 4 of the present invention;

FIG. 5($a$) shows a large graphene sheet transferred onto a 4-inch silicon wafer prepared in Preparation Example 1 of the present invention, FIG. 5($b$) is a schematic diagram of the thermoelectric measurement system, FIG. 5($c$) shows the thermoelectric voltage measured in the initial state without a temperature difference, FIG. 5($d$) shows the thermoelectric voltage measured in the high-temperature (Heat) state of the right side, and FIG. 5($e$) shows the thermoelectric voltage measured in the high-temperature (Heat) state of the left side;

FIG. 6 is a graph showing the thermoelectric voltages depending on doping conditions of the graphene thermoelectric devices of Preparation Examples 5 to 7 of the present invention;

FIG. 7 is a graph showing the Seebeck coefficients of the graphene thermoelectric devices of Preparation Examples 5 to 7 of the present invention;

FIG. 8 is a graph showing the power factors of graphene thermoelectric devices of Preparation Examples 5 to 7 of the present invention; and FIG. 9($a$) is a graph showing the thermoelectric voltages of the graphene thermoelectric devices prepared in Preparation Examples 6, 8 and 9 of the present invention, FIG. 9($b$) is a graph showing the Seebeck coefficients, FIG. 9($c$) is a graph showing the power factors, FIG. 9($d$) shows the band alignment of graphene thermoelectric device prepared in Preparation Example 6, FIG. 9($e$) shows the band alignment of graphene thermoelectric device prepared in Preparation Example 8, and FIG. 9($f$) shows the band alignment of graphene thermoelectric device prepared in Preparation Example 9.

DETAILED DESCRIPTION OF THE INVENTION

Hereinafter, embodiments according to the present invention will be described in detail with reference to the accompanying drawings.

While the present invention allows for various modifications and variations, specific embodiments thereof are illustrated by the drawings, which will be described in detail below. However, it is not intended to limit the invention to the particular forms disclosed, but rather the invention includes all modifications, equivalents, and substitutes consistent with the spirit of the invention as defined by the claims.

It will be understood that when an element such as a layer, region or substrate is referred to as being "on" another element, it can be directly on the other element or intervening elements may also be present.

It will be understood that, although the terms "first", "second", etc. may be used herein to describe various elements, components, regions, layers and/or sections, these elements, components, regions, layers and/or sections should not be limited by these terms.

FIG. 1 is a flowchart illustrating a method for manufacturing a graphene thermoelectric device according to an embodiment of the present invention.

Referring to FIG. 1, the method for manufacturing the graphene thermoelectric device of the present invention may comprise the steps of: forming a graphene channel layer on a substrate (S10); forming a thermoelectric structure by depositing a first electrode and a second electrode on both ends of the graphene channel layer (S20); and doping the graphene channel layer by dipping the thermoelectric structure into a doping solution (S30).

First, a graphene channel layer may be formed on a substrate. The graphene channel layer may serve as a channel in the graphene thermoelectric device of the present invention. The graphene channel layer may be composed of monolayer graphene.

The substrate serves as a support for the graphene thermoelectric device of the present invention and can be made of any material suitable for use as a substrate for thermoelectric devices, without any limitations. For example, the substrate may be a crystalline silicon substrate, an amorphous silicon substrate, a silicon substrate having a $Bi_2Te_3$ layer, a silicon-on-insulator (SOI) substrate, a sapphire substrate, or a glass substrate, but is not limited thereto.

The step of forming a graphene channel layer on a substrate may comprise: forming graphene on a metallic material (S11); sequentially forming a first support layer and a second support layer on the graphene to prepare a graphene film (S12); removing the metallic material (S13); transferring the graphene film from which the metallic material is removed to the substrate in a vacuum environment (S14); and removing the first support layer and the second support layer (S15).

First, graphene may be formed on a metallic material. The metallic material may correspond to a base material for forming graphene. Specifically, for example, the metallic material may comprise at least one metal or allow selected from the group consisting of copper (Cu), silicon (Si), nickel (Ni), cobalt (Co), iron (Fe), platinum (Pt), aluminum (Al), chromium (Cr), magnesium (Mg), manganese (Mn), molybdenum (Mo), rhodium (Rh), tantalum (Ta), titanium (Ti), tungsten (W), zinc (Zn), vanadium (V), brass, bronze, white brass, stainless steel and germanium (Ge).

The metallic material may be in the form of a copper (Cu) foil. In this case, the copper (Cu) foil may serve as a catalyst for forming graphene.

The step of forming graphene on the metallic material (S11) may be performed by conventional chemical vapor deposition. Specifically, for example, the chemical vapor deposition may include thermal chemical vapor deposition, high-temperature chemical vapor deposition (HTCVD), inductively coupled plasma chemical vapor deposition (ICP-CVD), low pressure chemical vapor deposition (LPCVD), atmospheric pressure chemical vapor deposition (APCVD), metal organic chemical vapor deposition (MOCVD), plasma chemical vapor deposition (PECVD), etc., but is not limited thereto.

In detail, when a reaction gas containing a carbon source is supplied onto the metallic material and subjected to heat treatment by the chemical vapor deposition, the carbon components within the carbon source can be combined to form graphene with a layered structure.

Then, a first support layer and a second support layer may be sequentially formed on the graphene to prepare a graphene film. That is, the graphene film may have a structure where the metallic material, the graphene, the first support layer, and the second support layer are sequentially stacked in this order.

Specifically, the first support layer and the second support layer may be configured to support and protect the graphene formed on the metallic material so that the graphene is not damaged during the transfer to the substrate of the thermoelectric device of the present invention.

The first support layer may be formed by applying polymethylmethacrylate (PMMA) or poly(bisphenol-A-carbonate) (PC) to the graphene by a conventional method such as spin-coating.

The second support layer may be formed by applying a thermal release tape to the first support layer formed on the graphene. The thermal release tape maintains adhesive strength at room temperature and can be easily separated from the adhered layer when heated. The thermal release tape may be those used in a dicing process of semiconductor wafers.

Subsequently, the metallic material may be removed. That is, the metallic material is selectively removed from the graphene film, and the specific removal method may vary depending on the type of metallic material used.

The metallic material may be a copper foil. Specifically, the copper foil may be removed from the graphene film by wet-etching using a conventional copper etchant.

In more detail, the copper foil may be dipped into a dip bath containing a copper etchant for 10 to 15 minutes. If the dipping time is less than 10 minutes, the etching of the copper foil may not be sufficiently complete, and if the dipping time exceeds 15 minutes, there is a risk of damaging the graphene bonded to the copper foil.

As the metallic material is removed, the graphene film may have a structure where the graphene, the first support layer, and the second support layer are sequentially stacked in this order.

Then, the graphene film from which the metallic material is removed may be treated with an acidic solution such as hydrochloric acid (HCl) to remove any residual metal ions, followed by drying. As a result, it is possible to increase the efficiency of removing the metallic material and to maintain the inherent properties of graphene even after the transfer process.

Thereafter, the graphene film from which the metallic material is removed may be transferred to the substrate in a vacuum environment. That is, the graphene film from which the metallic material is removed may be transferred to the substrate of the thermoelectric device of the present invention and then attached to the substrate. As a result, it is possible to form a structure where the graphene, the first support layer, and the second support layer are sequentially stacked in this order on the substrate.

The vacuum environment during the transfer of the graphene film from which the metallic material is removed may be at a pressure of $10^{-3}$ Torr. The vacuum-transfer of graphene may be performed by a conventional vacuum-transfer device. By the vacuum-transfer of graphene, it is possible to minimize incidental and nonuniform doping from nanoscale air gaps, water or organic molecules that may occur during the transfer of graphene.

Then, the first support layer and the second support layer may be removed. As a result, only the graphene may be formed on the substrate.

That is, the first support layer and the second support layer may be removed from the structure where the graphene, the first support layer, and the second support layer are sequentially stacked in this order on the substrate.

Preferably, the second support layer composed of a thermal release tape may be separated from the graphene film at a temperature of 200 to 210° C. In one embodiment, if the temperature at which the second support layer is removed is less than 200° C., it may be difficult to effectively remove the thermal release tape as it may not be dissolved. Moreover, if the temperature at which the second support layer is removed exceeds 210° C., it may affect the properties of graphene that constitutes the graphene film.

Subsequently, the first support layer may be removed by wet-etching by sequentially adding acetone, methanol, and deionized water to the substrate on which the graphene and the first support layer are sequentially stacked.

According to the embodiment, the graphene may be patterned to form a graphene channel region. In order to use the graphene disposed on the substrate as a channel of the thermoelectric device of the present invention, the channel region may be formed by a conventional patterning process such as lithography and $O_2$ plasma etching process.

Then, the first electrode and the second electrode may be deposited on both ends of the graphene channel layer to form a thermoelectric structure. That is, the first electrode and the second electrode may be formed on the substrate to face each other on both ends of the graphene channel layer, thereby forming a thermoelectric structure comprising the substrate, the graphene channel layer, the first electrode and the second electrode.

The first electrode and the second electrode may comprise a conductive material and may be electrically connected to each other through the graphene channel layer.

The first electrode and the second electrode may be formed by a conventional method. Specifically, for example, the first electrode and the second electrode may be formed of a highly conductive metal, such as gold (Au), nickel (Ni), aluminum (Al), copper (Cu), platinum (Pt), ruthenium (Ru), rhodium (Rh)), tungsten (W), cobalt (Co), palladium (Pd), titanium (Ti), tantalum (Ta), iron (Fe), molybdenum (Mo), hafnium (Hf), lanthanum (La), iridium (Ir), and silver (Ag), but is not particularly limited thereto.

Thereafter, the graphene channel layer may be doped by dipping the thermoelectric structure into a doping solution. That is, the graphene channel layer included in the thermoelectric structure may be p-type or n-type doped.

As described above, according to the method for manufacturing the graphene thermoelectric device of the present invention, since the graphene channel layer is chemically doped, it is possible to optimize the carrier type and junction profile, thereby improving the performance of the thermoelectric device.

Half or full area of the graphene channel layer may be selectively doped with a specific type of conductivity. That is, when doping the graphene channel layer in step S30, half of the graphene channel layer (50% of the full area of the graphene channel layer) may be p-type or n-type doped, or the full area of the graphene channel layer (100% of the area of the graphene channel layer) may be selectively p-type or n-type doped.

Specifically, this process may be performed to achieve an optimal thermoelectric performance by modulating the doping concentration of the graphene channel layer. The range of optimal doping concentration will be described in detail later in Preparation Examples and Experimental Examples.

The doping solution may comprise polymer containing positive charge such as PEI or polymer negative charge such as PAA.

The doping solution may comprise: at least one dopant selected from polyethylenimine (PEI) and polyacrylic acid (PAA); ethanol; and lithium perchlorate.

That is, the doping solution may be formed by diluting polyethyleneimine (PEI) as a dopant with ethanol and lithium perchlorate. Alternatively, the doping solution may be formed by diluting polyacrylic acid (PAA) as a dopant with ethanol and lithium perchlorate. Otherwise, when halves of the graphene channel layer are doped with different types of conductivity, the above-mentioned two types of doping solutions may be used for each half.

The graphene channel layer may be n-type doped with the doping solution containing polyethyleneimine (PEI). Specifically, the molecules of PEI are positively charged due to the hydrogen adsorbed on the amine groups of PEI via a protonation reaction, and these positive charges induce electrons in the graphene channel layer, resulting in the n-type doped graphene channel layer.

The graphene channel layer may be p-type doped with polyacrylic acid (PAA) as a dopant. Specifically, PAA has a negative charge because hydrogen atoms in the carboxyl groups of PAA are removed by a deprotonation reaction, and PAA induces holes in the graphene channel layer, resulting in the p-type doped graphene channel layer.

Subsequently, the thermoelectric structure including the doped graphene channel layer may be rinsed. This process may be performed to stop the doping process occurring in the graphene channel layer even after the doping process, thereby avoiding excessive doping. Specifically, for example, the thermoelectric structure may be rinsed several times with acetone or ethanol.

Another aspect of the present invention may provide a graphene thermoelectric device manufactured by the above-described method for manufacturing the graphene thermoelectric device. The description of the graphene thermoelectric device may refer to the description of the method for manufacturing the graphene thermoelectric device described above.

FIG. 2 is a cross-sectional view of a graphene thermoelectric device according to an embodiment of the present invention.

Referring to FIG. 2, the graphene thermoelectric device may comprise a substrate 10, a graphene channel layer 20 formed on the substrate 10 and including doped graphene, and a first electrode 30 and a second electrode 40 formed on both ends of the graphene channel layer 20.

The substrate 10 serves as a support for the graphene thermoelectric device of the present invention and can be made of any material suitable for use as a substrate for thermoelectric devices, without any limitations. For example, the substrate 10 may be a crystalline silicon substrate, an amorphous silicon substrate, a silicon substrate having a $Bi_2Te_3$ layer, a silicon-on-insulator (SOI) substrate, a sapphire substrate, or a glass substrate, but is not limited thereto.

The doped graphene channel layer 20 may be formed on the substrate 10. The doped graphene channel layer 20 may comprise n-type or p-type graphene or n-type graphene doped on one side and p-type graphene doped on the other side. The doped graphene channel layer may be a single layer graphene, and according to the embodiment, may have a channel region patterned on one side.

The doped graphene channel layer 20 is provided on the substrate 10 and is disposed between the first electrode 30 and the second electrode 40 to be electrically connected to the first electrode 30 and the second electrode 40.

The first electrode 30 and the second electrode 40 may include a conductive material and may be electrically connected to each other through the doped graphene channel layer 20.

Specifically, for example, the first electrode 30 and the second electrode 40 may be formed of a highly conductive metal, such as gold (Au), nickel (Ni), aluminum (Al), copper (Cu), platinum (Pt), ruthenium (Ru), rhodium (Rh)), tungsten (W), cobalt (Co), palladium (Pd), titanium (Ti), tantalum (Ta), iron (Fe), molybdenum (Mo), hafnium (Hf), lanthanum (La), iridium (Ir), and silver (Ag), but is not particularly limited thereto.

The graphene channel layer 20 may be obtained by doping half or full area of the graphene channel layer 20.

Specifically, half of the graphene channel layer 20 (50% of the full area of the graphene channel layer 20) may be p-type or n-type doped.

Moreover, the full area of the graphene channel layer (100% of the area of the graphene channel layer) may be selectively p-type or n-type doped.

Furthermore, one half of the graphene channel layer 20 may be p-type doped and the other half may be n-type doped.

Specifically, this process may be performed to improve the thermoelectric performance of the thermoelectric device including the doped graphene channel layer by modulating the doping concentration (i.e., the size of the doped area) of the graphene channel layer 20.

The graphene channel layer 20 may be n-type doped with polyethyleneimine (PEI). Specifically, half or full area of the graphene channel layer 20 may be n-type doped with a doping solution containing PEI. Specifically, the molecules of PEI are positively charged due to the hydrogen adsorbed on the amine groups of PEI via a protonation reaction, and these positive charges induce electrons in the graphene channel layer, resulting in the n-type doped graphene channel layer.

The graphene channel layer 20 may be p-type doped with polyacrylic acid (PAA). Specifically, half or full area of the graphene channel layer 20 may be p-type doped with a doping solution containing PAA. Specifically, PAA has a negative charge because hydrogen atoms in the carboxyl groups of PAA are removed by a deprotonation reaction, resulting in the p-type doped graphene channel layer.

As described above, according to the graphene thermoelectric device of the present invention, it is possible to improve the thermoelectric efficiency of the graphene thermoelectric device including the chemically doped graphene channel layer by modulating the doping concentration.

Moreover, according to the graphene thermoelectric device of the present invention, it is possible to effectively increase the power factor of the thermoelectric device by improving the heat dissipation during carrier diffusion in the doped graphene and the large size of the active region by means of the doped graphene channel layer.

FIG. 3 is a schematic diagram of graphene thermoelectric devices manufactured with and without a doping process and with different dopants according to an embodiment of the present invention.

Referring to FIG. 3, the graphene thermoelectric device including an undoped pristine graphene channel layer may be normally hole-doped by moisture and oxygen.

The graphene channel layer of the graphene thermoelectric device doped with polyacrylic acid (PAA) (shown as "PAA doping" in FIG. 3) may induce more hole carriers. On the contrary, the graphene channel layer of the graphene thermoelectric device doped with polyethyleneimine (PEI) (shown as "PEI doping" in FIG. 3) may induce more electron carriers therein.

Next, the present invention will be described in detail with reference to Preparation Examples and Experimental Examples.

However, the following Preparation Examples and Experimental Examples are merely illustrative of the present invention, and the contents of the present invention are not limited to the following Preparation Examples and Experimental Examples.

Experimental Example 1: Analysis of Current-Voltage (I-V) Characteristics of Graphene Field Effect Transistors (GFETs)

1.1. Preparation of Graphene Thermoelectric Materials and Graphene Field Effect Transistors Preparation Example 1: Preparation of Graphene Thermoelectric Material Graphene (GR) was grown on a copper (Cu) foil having a thickness of 25 μm and a size of 7×7 cm² by thermal chemical vapor deposition to form a graphene layer (GR/Cu), and polymethylmethacrylate (PMMA) was coated onto the graphene layer and baked in an oven at 80° C. for 5 minutes (PMMA/GR/Cu).

Thermal release tape having a width of 10 cm or less was then applied to the PMMA/GR/Cu layer to form a thermal release tape/PMMA/GR/Cu thin film, and then wet-etched using Cu etchant (Transene, CE100) for 10 min to form a film consisting of the thermal release tape, PMMA, and GR.

The resulting thermal release tape/PMMA/GR film was treated with hydrochloric acid (HCl) to remove the residual Cu ions and blow-dried.

The dried thermal release tape/PMMA/GR film was degassed in a vacuum of $10^{-3}$ Torr, and then transferred to the SiO$_2$/Si substrate while slowly raising the temperature from 175° C. to 220° C. at a rate of 10° C./min. The thermal release tape was removed at a temperature of 220° C. with a mild pressure applied to the substrate after the transfer of the thermal release tape/PMMA/GR film, and the PMMA residue was removed by washing with acetone, methanol, and DI water. Finally, the 7×7 cm² graphene layer transferred onto the SiO$_2$/Si substrate was cut into seven pieces to produce 7×1 cm² graphene strips.

Preparation Example 2: Preparation of Undoped Graphene Field Effect Transistor (GFET)

After covering the graphene thermoelectric material of Preparation Example 1 with a 30 nm-thick gold (Au) hard mask, the active channel regions of the graphene field effect transistor (GFET) (W/L=10 μm/10 μm) were patterned by lithography and O$_2$ plasma etching process, and then Au source/drain electrodes were deposited.

Preparation Example 3: Preparation of PAA-Doped Graphene Field Effect Transistor (GFET)

The graphene field effect transistor (GFET) was fabricated to observe the effects of doping on the graphene.

The polyacrylic (PAA) solution was prepared by diluting PAA with ethanol (0.2 wt %) and lithium perchlorate (0.2 wt %). Then, the undoped graphene field effect transistor (GFET) prepared in Preparation Example 2 was dipped into the PAA solution for 1 hour and then rinsed in ethanol, resulting in the PAA-doped channel regions.

Preparation Example 4: Preparation of PEI-Doped Graphene Field Effect Transistor (GFET)

The graphene field effect graphene field effect transistor (GFET) was fabricated to observe the effects of doping on the graphene.

The polyethyleneimine (PEI) solution was prepared by diluting PEI with ethanol (0.2 wt %) and lithium perchlorate (0.2 wt %). Then, the undoped graphene field effect transistors (GFETs) prepared in Preparation Example 2 was dipped into the PEI solution for 1 hour and then rinsed in ethanol, resulting in the PEI-doped channel regions.

1.2. Measurement of Current-Voltage (I-V) Characteristics of Graphene Field Effect Transistors (GFETs)

The current-voltage (Id-Vg) characteristics of the graphene field effect transistors (GFETs) prepared in Preparation Examples 2 to 4 were observed at a drain current of 0 μA to 100 μA and a gate voltage of −20 V to 40 V.

FIG. 4 shows transfer curves of the graphene field effect transistors (GFETs) prepared in Preparation Examples 2 to 4 of the present invention.

Referring to FIG. 4, the I-V curve of the undoped GFET of Preparation Example 2 was shifted to the positive-bias region. This can be attributed to the hole carriers induced by intrinsic doping from oxygen and moisture adsorption.

In the case of the PAA-doped n-type GFET of Preparation Example 3, the Dirac point was shifted to the left.

Conversely, in the case of the PAA-doped p-type GFET of Preparation Example 4, the Dirac point was shifted to the right.

Thus, it can be seen that the successful modulation of the electrical conductivity and carrier type of graphene was achieved via polymer doping.

Experimental Example 2: Analysis of Thermoelectric Performance Depending on Doping Conditions of Graphene Thermoelectric Devices

2.1. Preparation of Graphene Thermoelectric Devices

Preparation Example 5: Preparation of Undoped Graphene Thermoelectric Device

The graphene thermoelectric material was prepared in the same manner as in Preparation Example 1, and gold (Au) was deposited on both ends of the graphene thermoelectric material for the first electrode and the second electrode to prepare a thermoelectric device.

Preparation Example 6: Preparation of PAA-Doped Graphene Thermoelectric Device

The graphene thermoelectric material was prepared in the same manner as in Preparation Example 1, and gold (Au) was deposited on both ends of the graphene thermoelectric material for the first electrode and the second electrode to prepare a thermoelectric device.

The polyacrylic (PAA) solution was prepared by diluting PAA with ethanol (0.2 wt %) and lithium perchlorate (0.2 wt %). Then, the graphene thermoelectric device was dipped into the PAA solution for 1 hour and then rinsed in ethanol, resulting in the PAA-doped graphene channel layer.

Preparation Example 7: Preparation of PEI-Doped Graphene Thermoelectric Device

The graphene thermoelectric material was prepared in the same manner as in Preparation Example 1, and gold (Au) was deposited on both ends of the graphene thermoelectric material for the first electrode and the second electrode to prepare a thermoelectric device.

The polyethyleneimine (PEI) solution was prepared by diluting PEI with ethanol (0.2 wt %) and lithium perchlorate (0.2 wt %). Then, the graphene thermoelectric device was dipped into the PEI solution for 1 hour and then rinsed in ethanol, resulting in the PEI-doped graphene channel layer.

2.2. Measurement of Performance of Thermoelectric Devices Depending on Doping Conditions of Graphene Thermoelectric Devices 2.2.1. Measurement of Electrical Conductivity The electrical conductivities of the graphene channel layers in the graphene thermoelectric devices prepared in Preparation Examples 5 to 7 were measured.

The electrical conductivity of each specimen was calculated by measuring their resistance using a multimeter.

As a result of the measurement, the electrical conductivity of the undoped graphene of Preparation Example 5 was 0.34 mS, the conductivity of the PAA-doped graphene in Preparation Example 6 was 0.789 mS, and the electrical conductivity of the PEI-doped graphene was 0.115 mS.

In general, the electrical conductivity of graphene is determined by the location of the Fermi level and charge type, and thus the conductivity increases as the Fermi level moves away from the charge-neutrality level, that is, the Dirac point. However, owing to initial hole doping due to oxygen adsorption, the electrical conductivity of undoped graphene is already high, and its Fermi level is lower than the charge-neutrality level.

Therefore, according to the graphene thermoelectric device of the present invention, it is possible to further improve the electrical conductivity of the graphene channel layer through the additional hole doping using polyacrylic acid (PAA); however, it is considered that electron doping using polyethyleneimine (PEI) initially compensates the hole concentration and tends to reduce the conductivity of the graphene channel layer. Moreover, as the polyethyleneimine (PEI) doping level increases, however, the Fermi level moves into the electron branch, and the conductivity increases.

2.2.2. Measurement of Thermoelectric Voltage of Graphene Thermoelectric Devices

FIG. 5(a) shows a large graphene sheet transferred onto a 4-inch silicon wafer prepared in Preparation Example 1 of the present invention, and FIG. 5(b) is a schematic diagram of the thermoelectric measurement system according to an embodiment of the present invention.

Referring to FIGS. 5(a) and 5(b), the thermoelectric voltages of the thermoelectric devices prepared in Preparation Examples 5 to 7 were measured using a temperature controller using two Peltier devices in the temperature range of −50 to −80° C. The measurements were repeated multiple times with the reverse temperature gradient. The values of the thermoelectric voltages measured multiple times were similar, and small differences in thermoelectric voltage may be attributed to the nonuniform conductivity of graphene, which is inevitable in large-area graphene.

FIG. 5(c) shows the thermoelectric voltage of the thermoelectric device measured in the initial state without a temperature difference, FIG. 5(d) shows the thermoelectric voltage of the thermoelectric device measured in the high-temperature (Heat) state of the right side, and FIG. 5(e) shows the thermoelectric voltage of the thermoelectric device measured in the high-temperature (Heat) state of the left side.

Referring to FIG. 5(c), it was observed that the thermoelectric voltage in the absence of a temperature difference was 0 mV to 0.0028 mV.

Referring to FIG. 5(d), it was observed that the potential difference of the thermoelectric voltage measured when the temperature of the right side was 10K higher than the temperature of the left side was −0.413 mV. This is because the hole carriers move from right to left.

Referring to FIG. 5(e), it was observed that the potential difference of the thermoelectric voltage measured when the temperature of the left side was 10K higher than the temperature of the right side was 0.522 mV. This is because the hole carriers move from left to right.

Furthermore, 7×7 $cm^2$ of graphene is used in Preparation Example 1, but full transfer to a 12-inch wafer is possible if needed.

FIG. 6 is a graph showing the thermoelectric voltages depending on doping conditions of the graphene thermoelectric devices prepared in Preparation Examples 5 to 7 of the present invention.

Referring to FIG. 6, it can be seen that the thermoelectric voltage of the graphene thermoelectric device of Preparation Example 5 showed a near-linear temperature dependence in the range of 0 to 20K.

The thermoelectric voltage of the PAA-doped graphene thermoelectric device increased to 0.63 mV at $\Delta T=20K$.

The PEI-doped graphene thermoelectric device of Preparation Example 7 showed a negative thermoelectric voltage value of −0.5 mV at ΔT=20K. This may indicate that the type of carrier dominating the thermoelectric effect in this case is different from that in the case of PAA.

Therefore, it can be confirmed that the major carriers of PEI-doped graphene is electrons and that its Fermi level is indeed above the Dirac point.

2.2.3. Measurement of Seebeck Coefficient of Graphene Thermoelectric Devices The Seebeck coefficient is measured and calculated through the following Equation (1).

(Thermal electromotive force)=(Seebeck coefficient [μV/K])×(Temperature difference)   Equation (1)

That is, a higher Seebeck coefficient may result in a high-quality thermoelectric device capable of obtaining a large electromotive force.

FIG. 7 is a graph showing the Seebeck coefficients of the graphene thermoelectric devices prepared in Preparation Examples 5 to 7 of the present invention.

Referring to FIG. 7, the Seebeck coefficients of the graphene thermoelectric devices of Preparation Examples 5 to 7 are 76, 115, and 70 μV/K, respectively.

In addition, although the Seebeck coefficient is affected by the doping level, which affects the conductivity of graphene, differences in electron mobility should also be considered. In the measuring devices, the mobility of electrons was relatively lower than that of holes ($\mu_{FE,e}$=211 cm$^2$/Vs, and. $\mu_{FE,h}$=300 cm$^2$/Vs in the undoped graphene field effect transistor (GFET) of Preparation Example 2).

That is, it can be seen that the Seebeck coefficient may also be influenced by the carrier mobility. Therefore, it can be seen that increasing the carrier concentration and mobility of graphene is necessary to improve the thermroelectric characteristics of graphene thermoelectric devices.

2.2.4. Measurement of Power Factor of Graphene Thermoelectric Devices

Generally, power is expressed as the product of voltage (V) and current (I), but in the case of alternating current (AC), the power varies depending on the time difference between voltage and current (i.e., phase difference, ϕ), and thus it is expressed as P (power)=V (voltage)×I (current)× cos ϕ (phase difference). This is called effective power, and in this case, cos(1) represents the ratio of effective power to apparent power, which is known as the power factor. The power factor varies depending on the type or nature of the load and is commonly expressed as a percentage. That is, the power factor is measured and calculated through the following Equation (2):

Power factor=(Power)/(Voltage×Current)   Equation (2)

FIG. 8 is a graph showing the power factors of graphene thermoelectric devices prepared in Preparation Examples 5 to 7 of the present invention.

Referring to FIG. 8, the power factor in Preparation Example 5 is approximately 500 μW/mK$^2$, and in the PAA-doped thermoelectric device of Preparation Example 6, this value increased to 3070 μW/mK$^2$, indicating that the power factor has increased by more than 600% compared to Preparation Example 5.

When the power factors obtained under different doping conditions were compared, the highest power factor was obtained from the PAA-doped thermoelectric device of Preparation Example 6 owing to its high electrical conductivity despite the absence of significant differences in Seebeck coefficient and thermoelectric voltage among the devices. In other words, after doping of the graphene channel layer, the electrical conductivity of the thermoelectric device increased by approximately two-fold, and its power factor increased by six-fold, from which it can be seen that the thermoelectric characteristics can be improved by the chemical doping process of graphene according to the present invention.

2.2.5. Conclusion of the Performance Analysis of Graphene Thermoelectric Devices As described above, as a result of analyzing the performance, the large-area graphene thermoelectric device having an active region of 7×1 cm$^2$ manufactured according to the present invention exhibited the highest power factor of 14000 μW/mK$^2$ at ΔT=18K. As such, the improved power factor of the graphene thermoelectric device according to the present invention could be attributed to several factors, including enhanced conductivity due to chemical doping of the graphene channel layer in the thermoelectric device, heat dissipation during carrier diffusion, and the large size of the active region. Moreover, the 7×7 cm$^2$ graphene transfer technology, which is suggested in the method for manufacturing the graphene thermoelectric device of the present invention, can be applied to flexible devices, and thus it is expected that it can also be applied to large-area flexible thermoelectric devices.

Experimental Example 3: Analysis of Thermoelectric Performance Depending on Doping Concentrations of Graphene Thermoelectric Devices

3.1. Preparation of Graphene Thermoelectric Devices Under Different Doping Concentrations

Preparation Example 8: Preparation of Graphene Thermoelectric Device with PAA Half-Doped Graphene Channel Layer The graphene thermoelectric material was prepared in the same manner as in Preparation Example 1, and gold (Au) was deposited on both ends of the graphene thermoelectric material for the first electrode and the second electrode to prepare a thermoelectric device.

The polyacrylic (PAA) solution was prepared by diluting PAA with ethanol (0.2 wt %) and lithium perchlorate (0.2 wt %). Then, half of the graphene thermoelectric device was dipped into the PAA solution for 1 hour and then rinsed in ethanol, resulting in the PAA half-doped graphene channel layer.

Preparation Example 9: Preparation of PAA Half-Doped/PEI-Half Doped Graphene Thermoelectric Device The graphene thermoelectric material was prepared in the same manner as in Preparation Example 1, and gold (Au) was deposited on both ends of the graphene thermoelectric material for the first electrode and the second electrode to prepare a thermoelectric device.

The polyacrylic (PAA) solution was prepared by diluting PAA with ethanol (0.2 wt %) and lithium perchlorate (0.2 wt %). Then, half of the graphene thermoelectric device was dipped into the PAA solution for 1 hour and then rinsed in ethanol, resulting in the PAA half-doped graphene channel layer.

Subsequently, the polyethyleneimine (PEI) solution was prepared by diluting PEI with ethanol (0.2 wt %) and lithium perchlorate (0.2 wt %). Then, the other half of the graphene thermoelectric device was dipped into the PEI solution for 1 hour and then rinsed in ethanol, resulting in the PEI half-doped graphene channel layer.

3.2. Measurement of Thermoelectric Performance of Graphene Thermoelectric Devices Under Different Doping Concentrations

3.2.1. Measurement of Thermoelectric Voltage, Seebeck Coefficient and Power Factor of Graphene Thermoelectric Devices FIG. 9(a) is a graph showing the thermoelectric voltages of the graphene thermoelectric devices prepared in Preparation Example 6 (PAA fully doped), Preparation Example 8 (PAA half doped) and Preparation Example 9 (PAA-PEI doped) of the present invention, FIG. 9(b) is a graph showing the Seebeck coefficients of the graphene thermoelectric devices prepared in Preparation Examples 6, 8 and 9 of the present invention, FIG. 9(c) is a graph showing the power factors of the graphene thermoelectric devices prepared in Preparation Examples 6, 8 and 9, FIG. 9(d) shows the band alignment of graphene thermoelectric device prepared in Preparation Example 6 of the present invention, FIG. 9(e) shows the band alignment of graphene thermoelectric device prepared in Preparation Example 8 of the present invention, and FIG. 9(f) shows the band alignment of graphene thermoelectric device prepared in Preparation Example 9 of the present invention.

Referring to FIG. 9(a), the graphene thermoelectric device with the PAA half-doped/PEI half-doped graphene channel layer prepared in Preparation Example 9 showed the highest thermoelectric voltage. This is because of the built-in potential conferred by the doping process.

Referring to FIGS. 9(b) and 9(c), the PAA half-doped graphene thermoelectric device prepared in Preparation Example 8 showed the highest Seebeck coefficient and power factor.

Referring to FIGS. 9(d) to 9(f), these improvements of the Seebeck coefficient and power factor may be attributed to enhancements in carrier gradient owing to the generation of thermal carriers and a Fermi level gradient.

Specifically, the Fermi level gradient of the PAA half-doped graphene thermoelectric device of Preparation Example 8 was higher than that of the PAA fully doped graphene channel layer of Preparation Example 6.

3.2.2. Measurement of Electrical Conductivity

The electrical conductivity of the graphene thermoelectric device with the PAA fully-doped graphene channel layer of Preparation Example 6 was 0.789 mS, the electrical conductivity of the graphene thermoelectric device with the PAA half-doped graphene channel layer of Preparation Example 8 was 0.5932 mS, and the electrical conductivity of the PAA half-doped/PEI half-doped graphene thermoelectric device was 0.233 mS.

That is, the lowest electrical conductivity was observed in the PAA half-doped/PEI half-doped graphene thermoelectric device of Preparation Example 9, which is considered to be due to junction resistance.

3.3. Comparison of Graphene-Based Thermoelectric Device and Other Organic Thermoelectric Devices Table 1 below shows the comparison of graphene-based thermoelectric device and other organic thermoelectric devices.

TABLE 1

| Type of Material | Size | Seebeck Coefficient ($\mu$V/K) | Power Factor ($\mu$W/mK$^2$) |
|---|---|---|---|
| Preparation Example 6 | 1 × 7 cm$^2$ | 350 | 14000 |
| Au/h-BN/Graphene | 2 × 2 $\mu$m$^2$ | 215 | — |
| Graphene sheet | 5 × 20 $\mu$m$^2$ | 40~60 | 1000~5000 |
| Graphene nanoribbon | 5 × 0.03 $\mu$m$^2$ | 30 | 1.8 |
| PEI-doped rGO | 1 × 0.5 cm$^2$ | 16.9 | — |
| Pyrrole-graphene nano sheet | — | 32 | 10.24 |
| Pyrrole-MWCNT | — | 10 | 2.079 |
| Pyrrole-SWCNT | — | 33 | 83.2 |
| PEDOT:PDD-DMSO | — | — | 470 |
| P3HT/CNT | — | 102 | 325 |
| PANI-CWNT | — | — | 176 |

Referring to Table 1, the Seebeck coefficient of the graphene-based thermoelectric device was higher than those of other organic-based thermoelectric devices. Specifically, the graphene thermoelectric device of the present invention prepared in Preparation Example 6 showed a high Seebeck coefficient of ~350 $\mu$V/K power factor of 14000 $\mu$W/m K$^2$.

This is because heat is dissipated via air cooling while the carriers diffuse to the lower-temperature side of the graphene thermoelectric device, and it is considered that these improvements may be related to the size of the graphene thermoelectric device of the present invention.

Moreover, the thermal conductivity of the graphene thermoelectric device measured in Preparation Example 6 was 143 W/mK, which is much lower than the theoretical value (~3000 W/mK). This discrepancy can be explained by the aforementioned air-cooling effect.

According to the above-described method for manufacturing the graphene thermoelectric device of the present invention and the graphene thermoelectric device manufactured thereby of the present invention, it is possible to improve the electrical conductivity of graphene by chemical doping of graphene and modulation of doping concentration, thereby improving the thermoelectric efficiency of the graphene thermoelectric device including graphene. Moreover, it is possible to effectively increase the power factor of the thermoelectric device due to heat dissipation during carrier diffusion in the doped graphene and the large size of active region.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A method for manufacturing a graphene thermoelectric device, the method comprising the steps of:
- forming a graphene channel layer on a substrate;
- forming a thermoelectric structure by depositing a first electrode and a second electrode on both ends of the graphene channel layer; and
- doping the graphene channel layer by dipping the thermoelectric structure into a doping solution,
- wherein the doping solution comprises at least one dopant selected from polyethylenimine (PEI) and polyacrylic acid (PAA), ethanol, and lithium perchlorate.

2. The method for manufacturing a graphene thermoelectric device of claim 1, wherein forming of the graphene channel layer on the substrate comprises:
- forming graphene on a metallic material;
- sequentially forming a first support layer and a second support layer on the graphene to prepare a graphene film;
- removing the metallic material;
- transferring the graphene film from which the metallic material is removed to the substrate in a vacuum environment; and
- removing the first support layer and the second support layer.

3. The method for manufacturing a graphene thermoelectric device of claim 1, wherein doping of the graphene channel layer comprises selectively doping a half or full area of the graphene channel layer with a specific type of conductivity.

* * * * *